(12) United States Patent
Birch et al.

(10) Patent No.: US 9,077,342 B2
(45) Date of Patent: Jul. 7, 2015

(54) CIRCUIT ASSEMBLY FOR PROCESSING AN ELECTRICAL SIGNAL OF A MICROPHONE

(75) Inventors: Magnus Birch, Svedala (SE); Kaj Ullen, Bjarred (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 475 days.

(21) Appl. No.: 13/503,148

(22) PCT Filed: Aug. 11, 2011

(86) PCT No.: PCT/EP2011/004049
§ 371 (c)(1),
(2), (4) Date: Apr. 20, 2012

(87) PCT Pub. No.: WO2012/163379
PCT Pub. Date: Dec. 6, 2012

(65) Prior Publication Data
US 2012/0308041 A1    Dec. 6, 2012

(30) Foreign Application Priority Data

May 30, 2011    (WO) .................. PCT/EP2011/002675

(51) Int. Cl.
*H04B 15/00*    (2006.01)
*H03K 17/56*    (2006.01)
(Continued)

(52) U.S. Cl.
CPC .................. *H03K 17/56* (2013.01); *H04R 3/00* (2013.01); *H04R 2410/00* (2013.01); *H04M 1/6008* (2013.01); *H04M 1/6058* (2013.01)

(58) Field of Classification Search
CPC ............ H04R 1/34; H04R 1/40; H04R 1/326; H04R 1/342; H04R 1/406; H04R 29/006; H04R 3/005; H04R 5/033; H04R 5/027

USPC .............................. 381/26, 74, 94.1, 112–115
See application file for complete search history.

(56) References Cited

U.S. PATENT DOCUMENTS

| 4,156,800 A | * | 5/1979 | Sear et al. ..................... 381/114 |
| 4,539,441 A | * | 9/1985 | Eggert et al. .................. 381/323 |

(Continued)

FOREIGN PATENT DOCUMENTS

| GB | 2 377 848 A | 1/2003 |
| JP | 2006 071992 A | 3/2006 |
| WO | 99/38355 A1 | 7/1999 |

OTHER PUBLICATIONS

International Preliminary Report on Patentability, corresponding to PCT/EP2011/004049, date of issuance of report Dec. 2, 2013.

(Continued)

*Primary Examiner* — Simon Sing
(74) *Attorney, Agent, or Firm* — Renner, Otto, Boisselle & Sklar, LLP

(57) ABSTRACT

A circuit assembly for processing an electrical signal of a microphone is provided. The microphone has an inherent impedance. The circuit assembly comprises an impedance circuit, a signal processing unit, a first electrical signal path, and a second electrical signal path. The first electrical signal path is coupleable to a first electrical output of the microphone and is furthermore coupled to a first input of the signal processing unit. The second electrical signal path is coupleable to a second electrical output of the microphone and is furthermore coupled to a second input of the signal processing unit via the impedance circuit. An impedance value of the impedance circuit is selected based on an impedance value of the inherent impedance of the microphone.

12 Claims, 7 Drawing Sheets

(51) Int. Cl.
*H04R 3/00* (2006.01)
*H04M 1/60* (2006.01)

(56) References Cited

U.S. PATENT DOCUMENTS

| | | | |
|---|---|---|---|
| 5,844,997 A * | 12/1998 | Murphy, Jr. | 381/92 |
| 5,862,240 A * | 1/1999 | Ohkubo et al. | 381/356 |
| 6,104,816 A * | 8/2000 | Downs et al. | 381/94.1 |
| 6,222,928 B1 * | 4/2001 | Downs et al. | 381/111 |
| 6,266,423 B1 * | 7/2001 | Werrbach | 381/108 |
| 7,092,538 B2 * | 8/2006 | Potter et al. | 381/113 |
| 7,978,863 B2 * | 7/2011 | Kuiri | 381/111 |
| 8,422,409 B2 * | 4/2013 | Guo et al. | 370/278 |
| 2005/0156917 A1 | 7/2005 | Tobita | |
| 2005/0261039 A1 * | 11/2005 | Akino | 455/575.1 |
| 2009/0179768 A1 | 7/2009 | Sander et al. | |
| 2009/0251118 A1 | 10/2009 | Omi | |
| 2009/0296952 A1 | 12/2009 | Pantfoerder et al. | |
| 2010/0177924 A1 | 7/2010 | Xu | |

OTHER PUBLICATIONS

International Search Report, corresponding to PCT/EP2011/004049, mailed Dec. 23, 2011.
Written Opinion of the International Searching Authority, corresponding to PCT/EP2011/004049, mailed Dec. 23, 2011.
International Search Report, corresponding to PCT/EP2011/002675, mailed Mar. 2, 2012.
International Search Report of the International Searching Authority, corresponding to PCT/EP2011/002675, mailed Mar. 2, 2012.

* cited by examiner

Fig. 2

CIRCUIT ASSEMBLY FOR PROCESSING AN ELECTRICAL SIGNAL OF A MICROPHONE

FIELD OF THE INVENTION

The present invention relates to circuit assemblies for processing an electrical signal of a microphone, a device comprising a circuit assembly for processing an electrical signal of a microphone, a method for processing an electrical signal of a microphone, and a method of designing a circuit assembly for processing an electrical signal of a microphone. The invention relates especially to a reduction of disturbances on an electrical signal of a microphone when the microphone is connected to a device via a multi-port plug-and-socket connection. The disturbances may comprise for example a resonance, an echo, a crosstalk, or a so called bumblebee noise.

BACKGROUND OF THE INVENTION

Mobile devices, for example mobile phones or smart phones, are frequently used in connection with portable hands free sets (PHF). These portable hands free sets comprise for example a stereo earphone, a microphone and an antenna. The portable hands free set is usually connected to the mobile device via a phone jack. The phone jack may comprise a multi-port plug-and-socket connection comprising for example four electrical contacts providing signal paths for a left and a right earphone signal, a microphone signal, and ground. An antenna signal may additionally be transferred by one of these signal paths, for example via a signal path of the left or the right earphone signal.

However, currently there are at least two different audio connector standards used for these phone jacks, the OMTP (open mobile terminal platform) used in Europe and the CTIA (cellular telecommunications industry association) used in North America. The two connector types differ at least in an interchanged position of the ground and microphone contacts. Therefore, a circuit design is need which allows to change the signals associated to the contacts to support both standards. However, due to the demand to use a common ground for the earphone audio signals and the microphone signals in combination with the demand of transferring the antenna signal, disturbances may occur especially on the microphone signal.

Therefore, there is a need to reduce disturbance on a microphone signal.

SUMMARY OF THE INVENTION

According to the present invention, this object is achieved by a circuit assembly for processing an electrical signal of a microphone as defined in claim 1, a circuit assembly for processing an electrical signal of a microphone as defined in claim 3, a device as defined in claim 12, a method for processing an electrical signal of a microphone as defined in claim 14, and a method of designing a circuit assembly for processing an electrical signal of a microphone as defined in claim 15. The dependent claims define preferred and advantageous embodiments of the invention.

According to an aspect of the present invention a circuit assembly for processing an electrical signal of a microphone is provided. The microphone has an inherent impedance and comprises a first electrical output and a second electrical output. A voltage between the first electrical output and the second output corresponds to an acoustic input signal received by the microphone. The circuit assembly comprises an impedance circuit, a signal processing unit comprising a first input and a second input, a first electrical signal path, and a second electrical signal path. The first electrical signal path is coupleable to the first electrical output of the microphone, that means that the first electrical signal path can be coupled to the first electrical output of the microphone via e.g. a phone jack. Furthermore, the first electrical signal path is coupled to the first input of the signal processing unit. The second electrical signal path is coupleable to the second electrical output of the microphone and is further coupled to the second input of the signal processing unit via the impedance circuit. An impedance value of the impedance circuit is selected based on an impedance value of the inherent impedance of the microphone.

The microphone can be assumed to comprise a current source and an impedance in parallel. Therefore, an equivalent circuit of the microphone may comprise an ideal current source and the inherent impedance in parallel to the ideal current source. When coupling the above-described circuit assembly to the microphone, the first electrical output of the microphone is coupled directly to the signal processing unit and the second electrical output of the microphone is coupled via the second signal path and the impedance circuit to the signal processing unit. When a disturbing signal is added to the second electrical signal path, for example due to a common usage of the second electrical signal path by the microphone and an earphone as a common ground path, the disturbing signal influences a signal on the first electrical output of the microphone via the inherent impedance of the microphone, and the disturbing signal influences the signal of the microphone at the second electrical output of the microphone running through the impedance circuit. Therefore, the signal processing unit sees the disturbing signal at the first input through the inherent impedance of the microphone and at the second input through the impedance circuit. This allows the signal processing unit, for example by using a differential amplifier, to detect and compensate the disturbing signal.

According to an embdment, the circuit assembly may comprise a further impedance circuit which couples the second electrical signal path to ground. The second electrical signal path may be used as a common ground return path for the microphone and one or more earphone loudspeakers of a portable hands free set. By coupling the second electrical signal path via an impedance to ground, for example via an inductive impedance like a bead, a ground signal path can be provided and at the same time an antenna signal may be received from a wiring of the portable hands free set without being effected by the ground connection of the portable hands free set.

According to another embodiment, the first electrical signal path and the second electrical signal path are comprised in a multiport plug and socket connection for detachably connecting the microphone to the first and second electrical signal paths.

Thus, a detachable connection between the portable hands free set and a mobile device, for example a mobile phone, can be realized. The multiport plug and socket connection may comprise furthermore a third electrical signal path which is coupled to an electrical signal source feeding a further electrical signal with respect to ground into the third electrical signal path. The further electrical signal may comprise for example an audio output signal to be output by an earphone speaker of the portable hands free set. Furthermore, the multiport plug and socket connection may comprise a fourth electrical signal path which is coupled to an electrical signal source feeding another electrical signal with respect to ground into the fourth electrical signal path. The other electrical signal may comprise for example a further audio output signal for a further earphone speaker. Thus, a portable hands free set with stereo earphone speakers and a microphone can be realized. The first, second, third or the fourth electrical signal path may be furthermore coupled to a radio frequency receiver adapted to receive an antenna signal via the first, second, third or fourth electrical signal path, respectively. Thus, a portable hands free set providing audio input and output as well as a radio frequency antenna can be coupled to a mobile device via a multiport plug and socket connection with a minimum of electrical contacts in the multiport plug and socket connection. For example, a multiport plug and socket connection with four contacts may be sufficient to realize a stereo portable hands free set including a microphone and a radio frequency antenna.

However, as already described above in the background of the invention, currently there are at least two different standards for connecting a portable hands free set to a mobile device, the OMTP used in Europe and the CTIA used in North America. The two connector types differ at least in an interchanged position of the ground and microphone contacts. Therefore, according to another aspect of the present invention, a further circuit assembly for processing an electrical signal of a microphone is provided. The microphone has an inherent impedance and comprises a first electrical output and a second electrical output. A voltage between the first electrical output and the second electrical output corresponds to an acoustic input signal received by the microphone. The microphone may be comprised in a portable hands free set which is connectable to a mobile device comprising the circuit assembly via a multiport plug and socket connection. The circuit assembly comprises an impedance circuit, a processing unit comprising a first input and a second input, a first electrical signal path coupleable to the first electrical output of the microphone, and a second electrical signal path coupleable to the second electrical output of the microphone. Furthermore, the circuit assembly comprises three switches. A first switch is coupled to the first electrical signal path, the second electrical signal path and the first input of the signal processing unit. The first switch is configured to selectively couple the first electrical signal path or the second electrical signal path to the first input of the signal processing unit. A second switch is coupled to the first electrical signal path, the second electrical signal path and ground. The second switch is configured to selectively couple the first electrical signal path or the second electrical signal path to ground via a further impedance circuit. Thus, the first switch and the second switch allow to couple portable hands free sets in which a ground and a microphone signal may be interchanged at the first electrical signal path and the second electrical signal path. By appropriately controlling the first and the second switch, depending on the portable hands free set, the required ground and microphone signal connections can be provided. By coupling the second electrical signal path to ground via the further impedance circuit, an antenna signal can be received via the portable hands free set as described above. Furthermore, the circuit assembly comprises a third switch coupled to the first electrical signal path, the second electrical signal path and the second input of the signal processing unit. The third switch is configured to selectively couple the first electrical signal path or the second electrical signal path to the second input of the signal processing unit via the impedance circuit. An impedance value of the impedance circuit is selected based on an impedance value of the inherent impedance of the microphone. As described above, by using the first electrical signal path or the second electrical signal path as a common ground return path for the portable hands free set, a disturbance on the common ground return path may influence the electrical signals from the microphone. By additionally coupling the common ground return path via the impedance circuit to the signal processing unit via the third switch, the signal processing unit is facilitated to detect and reduce such a disturbance. As the switches themselves may have a resistance or an impedance, a disturbing signal e.g. due to an earphone signal on the common ground path may generate a disturbance due to the switch resistance or switch impedance. The switch resistance or switch impedance of the third switch is considerably smaller than the impedance of the impedance circuit and can be neglected. However, a disturbance generated due to the switch resistance or switch impedance of a switch coupled to ground may be considerable. Therefore, by providing the microphone signal at the first input of the processing unit and via the impedance circuit at the second input, the disturbance is thus detectable by the signal processing unit and can be removed or compensated.

According to an embodiment, the impedance value of the impedance circuit corresponds substantially to the impedance value of the inherent impedance of the microphone. The impedance circuit may comprise a series connection of a resistive element and a capacitive element. This combination of elements allows to approximate the inherent impedance of the microphone appropriately. E.g., the value of the impedance circuit may be in the same order of magnitude as the value of the inherent impedance.

According to an embodiment, the circuit assembly comprises furthermore a first low pass filter being coupled to the first input of the signal processing unit, and a second high pass filter being coupled to the second input of the signal processing unit. When the circuit assembly is used for coupling a portable hands free set to a mobile device, and the wiring of the portable hands free set is used as a radio frequency antenna, all signal paths may typically comprise inductive elements in a series connection, for example beads, to avoid a shortcut of the antenna signal. Furthermore, these inductive elements may also act as a part of a low pass filter for frequencies lower than for example 1-10 MHz, which may help to reject frequencies introduced from the outside. Furthermore, during an electrostatic discharge (ESD) the inductive elements may add an impedance during the first 100-1000 ns after a discharge that forces more current to flow through corresponding ESD protection diodes and less current through the circuits more sensitive protection diodes during this time. However, these inductive elements may generate resonance disturbances on the microphone signals provided to the signal processing unit. The low pass filters at the inputs of the signal processing unit may reduce such resonances, which may especially occur due to the inductive elements during electrostatic discharge (ESD) or current clamp tests.

According to another aspect of the present invention, a device is provided which comprises a multiport plug and socket connection for coupling the device to a microphone and a circuit assembly as described above. The device may comprise a mobile phone, a personal digital assistant, a mobile music player or a navigation system. The microphone may be comprised in a portable hands free set which may comprise additionally mono or stereo earspeakers and a radio frequency antenna for receiving for example broadcast radio frequency signals, especially radio broadcast signals in an FM frequency range.

According to another aspect of the present invention a method for processing an electrical signal of a microphone is provided. The microphone has an inherent impedance and provides a first electrical output signal and a second electrical output signal. A voltage between the first electrical output signal and the second electrical output signal corresponds to an acoustic input signal received by the microphone. According to the method, the second electrical output signal is guided through an impedance circuit, and an electrical microphone output signal is generated based on a signal difference between the first electrical output signal and the second electrical output signal guided through the impedance circuit. An impedance value of the impedance circuit is selected based on an impedance value of the inherent impedance of the microphone. For example, the impedance value of the impedance circuit corresponds substantially to the impedance value of the inherent impedance of the microphone.

According to yet another aspect of the present invention, a method of designing a circuit assembly for processing an electrical signal of a microphone is provided. The microphone has an inherent impedance and comprises a first electrical output and a second electrical output. A voltage between the first electrical output and the second electrical output corresponds to an acoustic input signal received by the microphone. According to the method, a signal processing unit comprising a first input and a second input is provided. The first electrical output of the microphone is coupled to the first input of the signal processing unit, and the second electrical output of the microphone is coupled to the second input of the signal processing unit via an impedance circuit. According to the method, and impedance value of the impedance circuit is selected based on the impedance value of the inherent impedance of the microphone.

Although specific features described in the above summary and the following detailed description are described in connection with specific embodiments, it is to be understood that the features of the embodiments may be combined with each other unless specifically noted otherwise.

BRIEF DESCRIPTION OF THE DRAWINGS

The invention will now be described in more detail with reference to the accompanying drawings.

FIG. 2 shows a circuit diagram comprising a circuit assembly according to an embodiment of the present invention.

DETAILED DESCRIPTION OF PREFERRED EMBODIMENTS

In the following, exemplary embodiments of the present invention will be described in more detail. It has to be understood that the following description is given only for the purpose of illustrating the principles of the invention and is not to be taken in a limiting sense. Rather, the scope of the invention is defined only by the appended claims and is not intended to be limited by the exemplary embodiments hereinafter.

It is to be understood that the features of the various exemplary embodiments described herein may be combined with each other unless specifically noted otherwise. Furthermore, any direct coupling of functional units or components in the embodiments shown in the Figures or described in the following detailed description may also be realized as an indirect coupling. Finally, same reference signs in the various instances of the drawings refer to similar or identical components.

Figure 1:
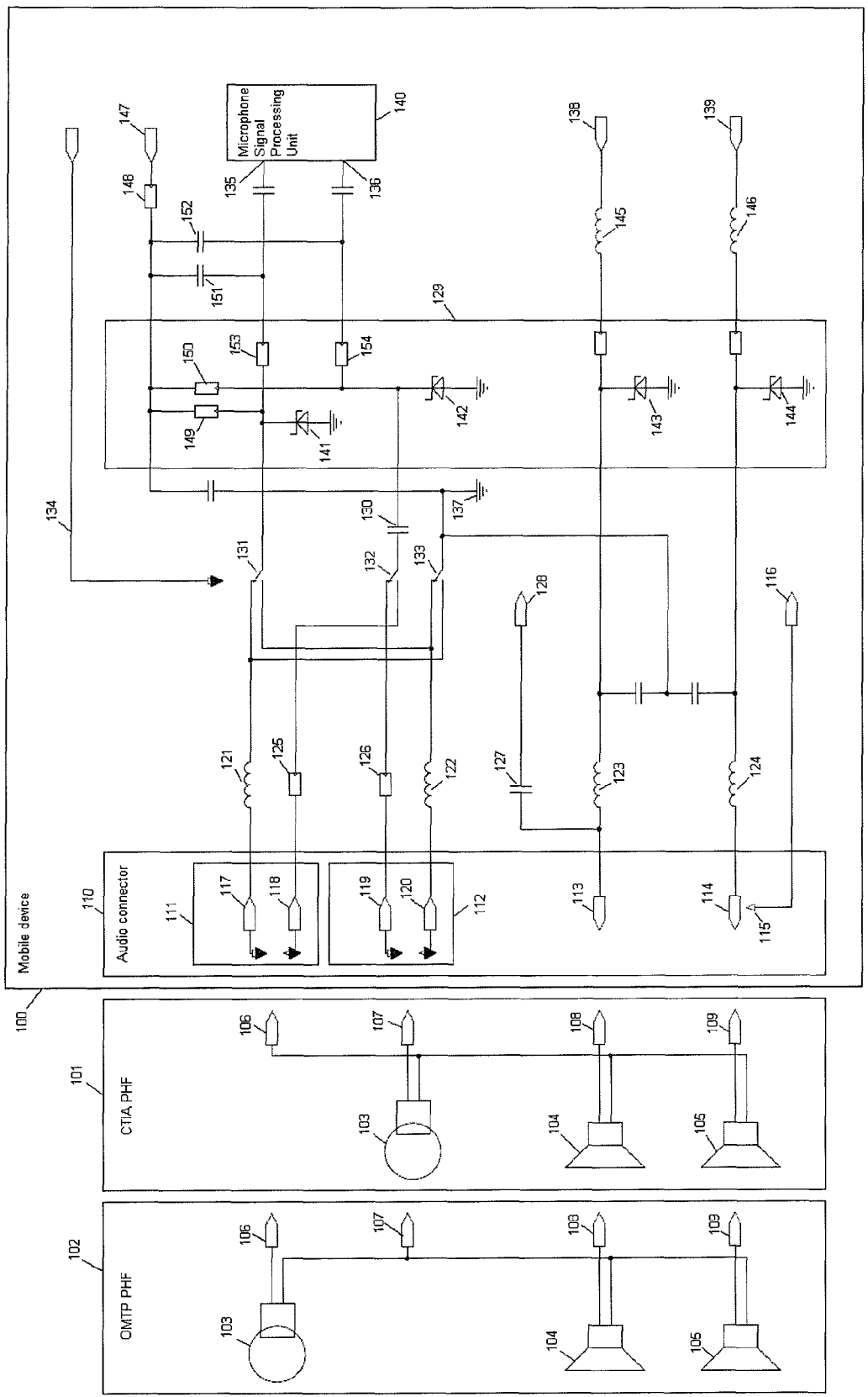
FIG. 1 shows a circuit diagram of a mobile device according to an embodiment of the present invention.

FIG. 1 shows a circuit diagram of a mobile device 100 adapted to adapt to a portable hands free set (PHF) according to either an OMTP or a CTIA standard. On the left hand side of FIG. 1 the two possible portable hands free sets 101 and 102 which can be connected to the mobile device 100 via an audio connector 110 are shown. Portable hands free set 101 is wired according to the CTIA standard and portable hands free set 102 is wired according to the OMTP standard. Each of the portable hands free sets 101, 102 comprises a microphone 103, a right earspeaker 104, and a left earspeaker 105. Furthermore, the wire to the right earspeaker 104 may be used as an FM antenna, as will be explained below. The portable hands free set 101, 102 may be connected to the audio connector 110 of the mobile device 100 via an audio jack. For example, the portable hands free set 101, 102 may comprise an audio jack plug with four terminals 106-109 which may be received by a corresponding audio jack socket of the audio connector 110 comprising four terminals 111-114 for establishing a connection to the corresponding terminals 106-109 of the portable hands free set. The audio jack plug and the audio jack socket constitute a so called multiport plug and socket connection. The audio connector 110 may comprise an additional electrical pin 115 which breaks the connection to terminal 114 when the audio jack plug of the portable hands free set is inserted into the audio connector 110. Pin 115 may be connected to a corresponding detect line 116 to detect when the portable hands free set is coupled to the mobile device 100. The terminals 111 and 112 of the audio connector 110 each comprise two terminals 117, 118 and 119, 120, respectively. Terminals 118 and 119 are used as so called "sense" terminals to couple the microphone 103 via an impedance comprising a resistor 125, 126 and a capacitance 130 to a microphone signal processing unit 140 to enable a disturbance reduction on the microphone signal, for example an echo cancellation, in the microphone signal processing unit 140 as will be described below. Terminal 118 is used as sense terminal when the CTIA portable hands free set 101 is connected to the mobile device 100, and terminal 119 is used as the sense terminal when the OMTP portable hands free set 102 is connected to the mobile device 100. By using these sense terminals 118, 119 it is possible to sense the lower side of the microphone 103 without any influence from the high currents generated to drive the earspeakers 104, 105.

As can be seen from the wirings of the CTIA portable hands free set (PHF) 101 and the OMTP portable hands free set (PHF) 102, the main difference between the two portable hands free sets is that the signal from the microphone 103 and the common ground are exchanged on terminals 106 and 107. In CTIA PHF 101 terminal 106 is the common ground for the microphone 103 and the earspeakers 104, 105, and terminal 107 is used for passing the signal from the microphone 103. In the OMTP PHF 102 the common ground is located at terminal 107 and the signal of the microphone 103 is passed via terminal 106. In both portable hands free sets 101, 102 a signal for the right earspeaker 104 is passed via terminal 108 and a signal for the left earspeaker 105 is passed via terminal 109. When one of the portable hands free sets 101, 102 is connected to the mobile device 100, terminal 109 is connected to terminal 114, terminal 108 is connected to terminal 113, terminal 107 is connected to terminal 112 (and thus to terminals 119, 120), and terminal 106 is connected to terminal 111 (and thus to terminals 117 and 118).

The wiring of the portable hands free set 101, 102 is additionally used as an FM antenna. Therefore, each of the terminals 113, 114, 117 and 120 of the audio connector 110 is first connected to corresponding ferrite beads 121-124 to provide high impedance for the FM antenna signal. For the sense terminals 118, 119 the resistors 125, 126 provide the high impedance for the FM antenna signal. The FM antenna signal is decoupled from terminal 113 via a capacitor 127 and provided for further use at terminal 128. Audio signals for the earspeakers 104 and 105 are provided at corresponding terminals 138 and 139.

To accomplish interworking with the different wiring of the CTIA PHF 101 and the OMTP PHF 102 three switches 131-133 are provided. The switches 131-133 may be simultaneously toggled from a first switching position to a second switching position and vice versa under control of a control signal on line 134. The switches 131-133 may be comprised in an integrated semiconductor circuit or a relay or a manual switch. The terminals 111 and 112 are coupled via the beads 121, 122 and the resistors 125, 126 to one side of the switches 131-133, and a first microphone input terminal 135 and a second microphone input terminal 136 of the microphone signal processing unit, and ground 137 are connected to another side of the switches 131-133. Additionally, for electrostatic discharge (ESD) protection at each coupling between the audio connector 110 and the microphone signal processing unit 140 a corresponding ESD diode 141, 142 is provided and connected to ground. Corresponding ESD diodes 143 and 144 are provided for ESD protection on signal paths coupled to terminals 113 and 114.

In the first switching position of the switches 131-133 the first microphone input terminal 135 is connected to terminal 117, the second microphone input terminal 136 is connected to terminal 119, and ground 137 is connected to terminal 120. Thus, in the first switching position the OMTP PHF 102 may be correctly driven by the mobile device 100. In the second switching position of the switches 131-133 the first microphone input terminal 135 is connected via switch 131 to terminal 120, the second microphone input terminal 136 is connected via the switch 132 to terminal 118, and ground 137 is connected via the switch 133 to terminal 117. Thus, in the second switching position the CTIA PHF 101 may be driven correctly by the mobile device 100. To sum up, the three switches 131-133 can select between OMTP and CTIA operation by cross connecting the microphone input signal of the microphone input terminals 135, 136 and the common ground 137. It should be noted that the ESD diodes 141-144 and additional components for EMC (electromagnetic compatibility) protection may be comprised in an integrated circuit 129 as shown in FIG. 1. Furthermore, the circuit 129 may also comprise components of an audio and current clamp input filtering system together with some capacitors and the current clamp rejecting system together with additional ferrite beads 145, 146.

At terminal 147 a bias voltage for driving the microphone 103 is provided via a resistor 148 and resistors 149, 150 to the microphone 103. Furthermore, at each microphone input terminal 135, 136 of the microphone signal processing unit 140 a filter comprising a capacitor 151, 152 and a resistor 153, 154 is provided for reducing resonance on the microphone signals during an ESD protection test or a current clamp test which may occur due to the beads 121-124.

Functioning of the circuit shown in FIG. 1, especially the principle of operation of the impedance circuit 125, 126, 130 of the sense terminals 118, 119 for reducing disturbances on the microphone signal, and especially the advantages arising from the use of the switch 132, will be described in more detail in connection with the circuit diagrams of FIGS. 2, 3 and 5.

Figure 2:
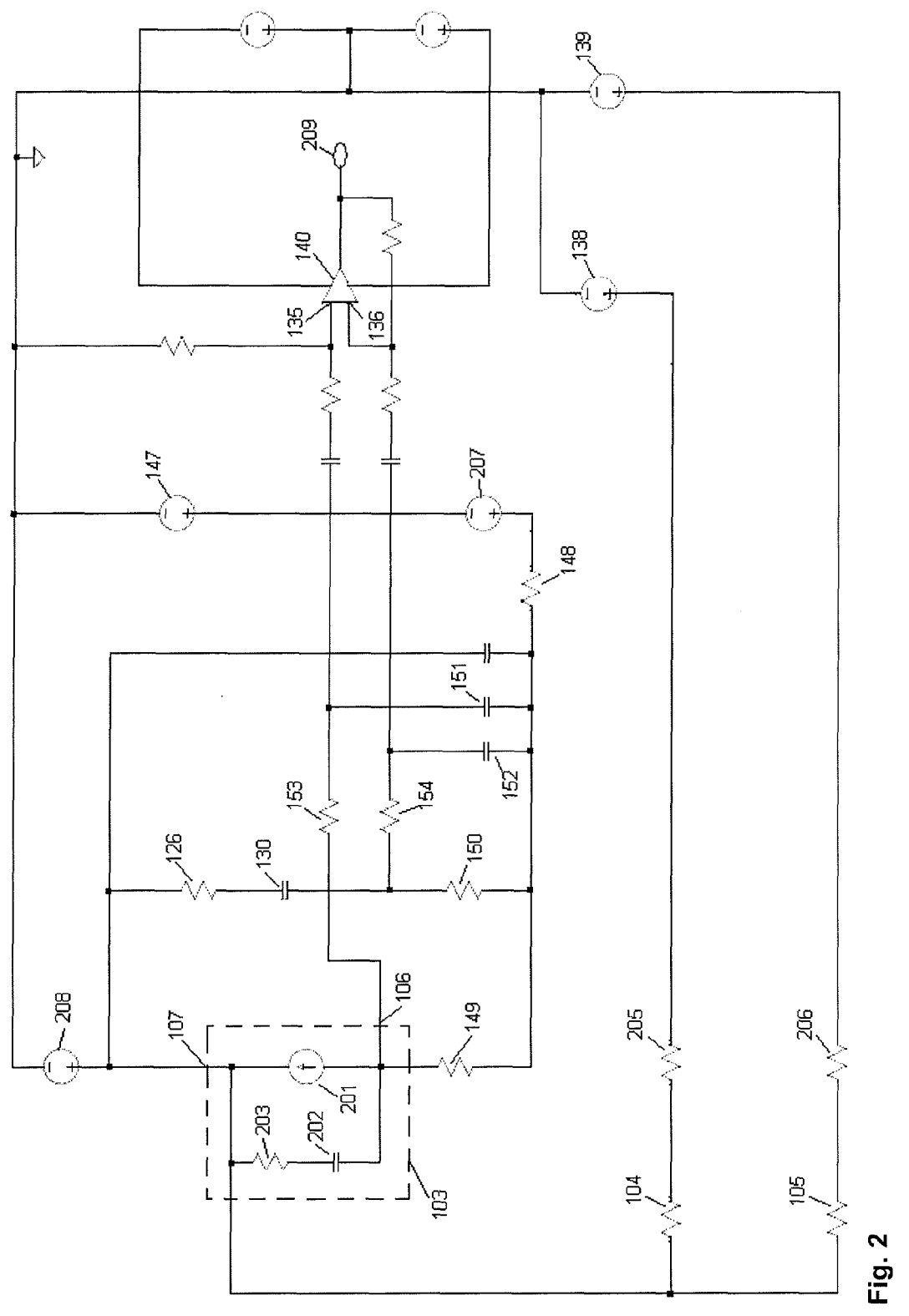

FIG. 2 shows a circuit diagram representing only the essential parts of the circuit diagram of FIG. 1, wherein some components of FIG. 1 are replaced by equivalent components for simulating the circuit diagram with an analogue circuit simulation tool. Same reference signs in FIG. 2 and FIG. 1 refer to same components or to equivalent components as will be described in the following. FIG. 2 shows the case in which the OMTP PHF 102 is coupled to the mobile device 100 and therefore the switches 131-133 are in the first switching position as shown in FIG. 1. The common ground return path of the microphone 103 and the earspeakers 104, 105 is therefore located at terminal 112, 107, 119, and 120. The common ground return path is connected via bead 122 and switch 133 to ground 137.

In FIG. 2 the microphone 103 is shown as an equivalent circuit comprising a current source 201 and in parallel an inherent impedance comprising a series connection of a capacitor 202 and a resistor 203. The earspeakers 104 and 105 are represented in FIG. 2 as resistors 104 and 105, respectively. A resistance of a signal path from the earspeaker signal sources 138, 139 to the earspeakers 104, 105 is represented in FIG. 2 by resistors 205, 206. The signal sources of the audio signals for the earspeakers 104, 105 are represented in FIG. 2 as oscillating voltage sources 138, 139. For a simulation (the simulation results will be discussed later), signal source 138 represents the audio source for the right channel and may have a frequency of for example 827 Hz, and signal source 139 may represent the left audio channel and may have a frequency of 1000 Hz. The bias voltage 147 is represented by a direct current voltage source 147 in FIG. 2. In series with this voltage source 147 an oscillating voltage source 207 is shown in FIG. 2 which represents a variation of the bias voltage when in practice of a mobile device the battery voltage drops for example during a GSM transmission burst. The disturbance generated by the transmission burst of a mobile phone working according to the GSM standard would typically generate a disturbing sound signal which is also called "bumblebee" noise due to its frequency profile. Furthermore, during such a transmission burst a ground potential may be raised and therefore an oscillating voltage source 208 is shown in FIG. 2 representing a corresponding disturbance on the ground signal. For the simulation, a frequency of the oscillating voltage sources 207, 208 may be selected at 1230 Hz. The microphone signal processing unit 140 of FIG. 1 is replaced in FIG. 2 by an operational amplifier 140 which receives at a first input 135 the signal from one end of the microphone 103 and at a second input 136 the signal from the other end of the microphone 103 guided through the impedance circuit comprising the resistor 126 and the capacity 130. At the output of the operational amplifier 140 a microphone signal 209 is provided.

Instead of simply processing the microphone signal from terminal 106 with respect to ground, the ground signal 107 of the common ground path of the portable hands free set is additionally guided through the impedance circuit comprising resistor 126 and capacitor 130 to the operational amplifier 140. The resistor 126 and the capacitor 130 are selected such that the resulting impedance corresponds substantially the inherent impedance of the microphone 103 represented by resistor 203 and capacitor 202. A value of the impedance circuit 126, 130 may be selected in the same order of magnitude as the impedance value of the inherent impedance 202, 203 of the microphone 103. For example, a typical microphone of a portable hands free set may have an inherent impedance with the capacitance 202 being about 4.7 μF and the resistance 203 being about 6 kΩ. Therefore, the capacitance 130 may be selected in a range of 1-10 μF and the resistor 126 may be selected in the range of 1-10 kΩ.

As can be seen from FIG. 2, when a disturbance on the common ground path occurs, for example due to a transmission burst of a GSM mobile device, this disturbance may be simulated by the oscillating voltage 208 which influences a voltage on the signal at 107. However, due to the impedance circuit 126, 130 which mirrors the inherent impedance 202, 203 of the microphone 103, this disturbance acts in the same way on both signals which are received at the inputs 135 and 136 of the operational amplifier 140. Therefore, the disturbance generated by the oscillating voltage 208 acts in a common mode on the operational amplifier 140 which performs a common mode rejection which reduces the disturbance on the microphone output signal 209.

In FIG. 1 the mirror impedance circuit is switched by a separate switch 132 instead of being switched together with switch 133. The reasons for this will be explained in the following in connection with FIGS. 3 and 5.

Figure 3:
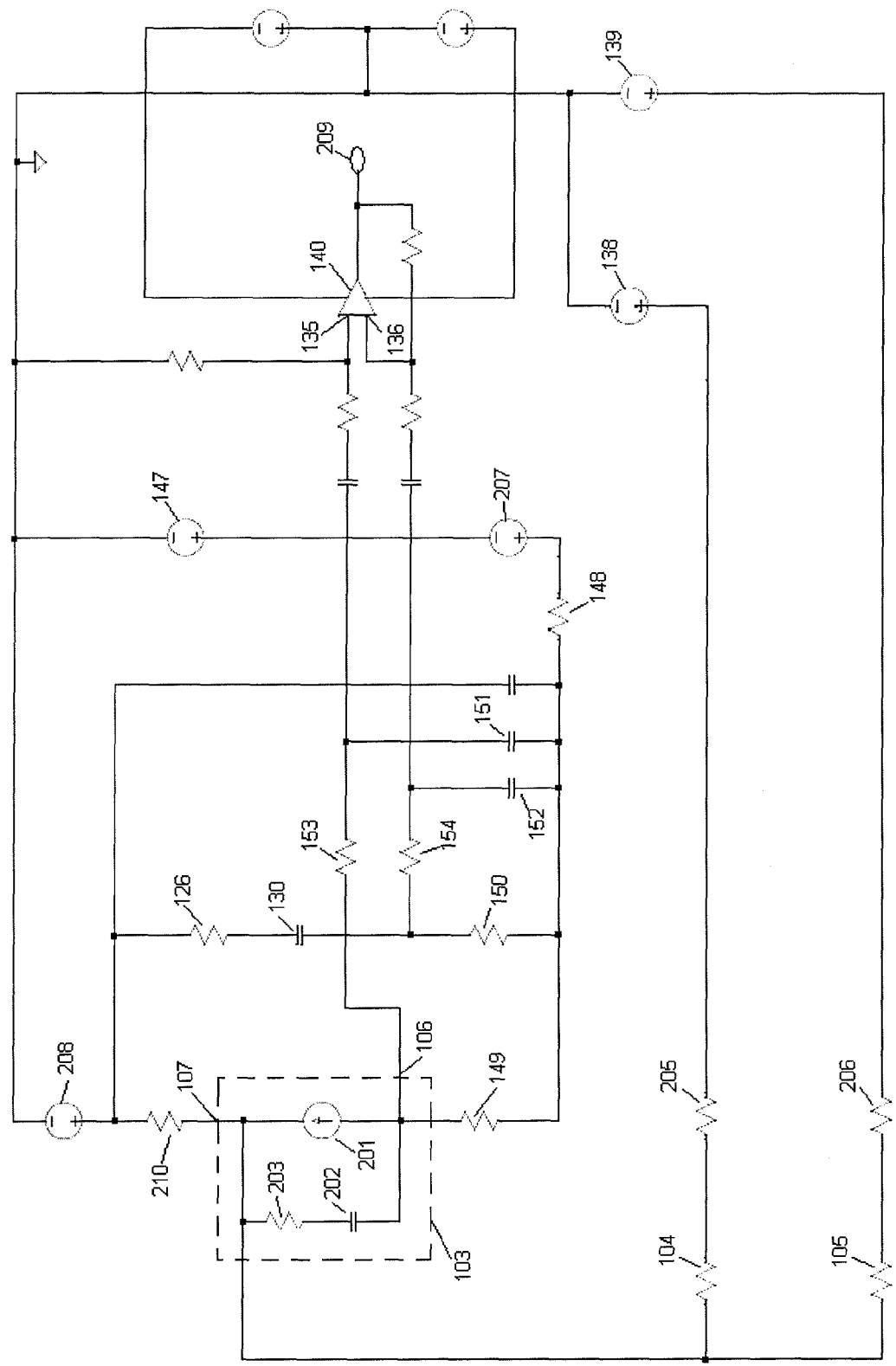
FIG. 3 shows a circuit diagram comprising a circuit assembly according to an embodiment of the present invention, which may be used for simulating the effect of the circuit assembly.

FIG. 3 shows a circuit diagram which may be used for simulating the circuit of FIG. 1 when only one switch instead of the two switches 133 and 132 is used. The circuit diagram of FIG. 3 is very similar to the circuit diagram of FIG. 2 and the only difference is an additional resistor 210 in the common ground return path. This additional resistor 210 represents a resistance of the audio connector 110, the bead 121 and the common switch which replaces the two switches 133 and 132. An assumed value of this resistor 210 may be 2Ω. When audio signals are output to the earspeakers 104, 105, these audio signals use the common return path and are therefore guided through resistor 210. This results in a voltage drop due to the audio signal for the earspeakers over resistor 210 which disturbs the output signal of the microphone 103 at the output 106 and the ground level of the microphone at the common ground 107. Therefore, an echo signal of the audio signal of the earspeakers is present at the microphone output 106.

Figure 4:
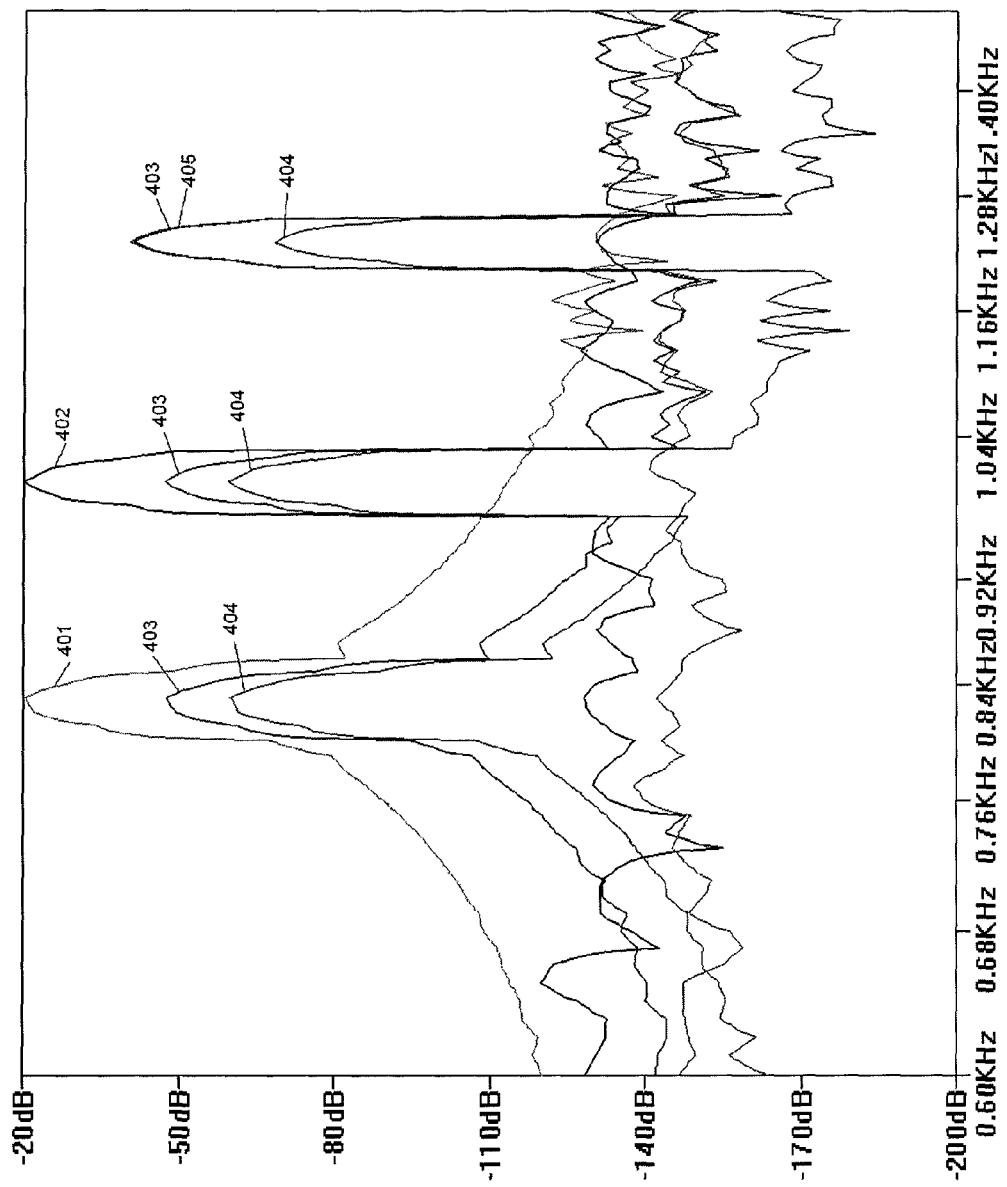
FIG. 4 shows simulation results of the circuit diagram of FIG. 3.

Simulation results for the circuit shown in FIG. 3 are depicted in FIG. 4. FIG. 4 shows a frequency spectrum 401 of the audio signal for the right earspeaker, a frequency spectrum 402 of the audio signal for the left earspeaker, a frequency spectrum 403 of the common ground return path (for example at 107), a frequency spectrum 404 at the output 209 of the operational amplifier 140, and a frequency spectrum 405 at the output of the oscillating voltage generator 208. As can be seen from FIG. 4, the signal 403 on the common ground return path (for example at 107) is about 30 dB below the audio signals 401, 402 for the right and the left earspeakers. At the output 209 the echo signals 404 from the right and left earspeakers are about 40 dB below the audio signals 401, 402 of the earspeakers. Furthermore, as shown in FIG. 4, the above-described bumblebee disturbance 405, which has in the frequency range around 1230 Hz the same spectrum as the spectrum 403 of the common ground return path, is reduced by the common mode rejection by around 30 dB (the peak of spectrum 403 is about −40 dB and the peak of the spectrum 404 is about −70 dB at 1230 Hz). As can be seen from FIG. 4, the common mode rejection works very efficiently (30 dB) on the bumblebee noise, but rather poor (10 dB between spectrum 403 and spectrum 404 at 827 Hz and 1000 Hz) for the echo reduction. The reason for this is that the voltage drop over resistor 210 is mainly influenced by the relatively high currents of the audio signals for the earphones on the common ground return path. This voltage drop cannot be compensated by the common mode rejection of the circuit of FIG. 3.

Therefore, in FIG. 1 two separate switches 132 and 133 are provided for coupling the common return path 107 separately to the mirror impedance circuit 126, 130 and to ground, respectively. A corresponding circuit diagram for simulating both switches 132 and 133 is shown in FIG. 5. Resistor 210 represents switch 133 connecting the common ground path to ground 137. Resistor 211 represents switch 132 connecting the common return path to the mirror impedance circuit 126, 130. A voltage drop over the resistor 210 due to the currents of the audio signals for the left and right earspeakers still occurs. However, this voltage drop will not occur over resistor 211 as resistor 211 is in series connection with the mirror impedance 126, 130 which is much higher than the resistance of the switch 132 (which may be assumed to 2Ω).

Figure 5:
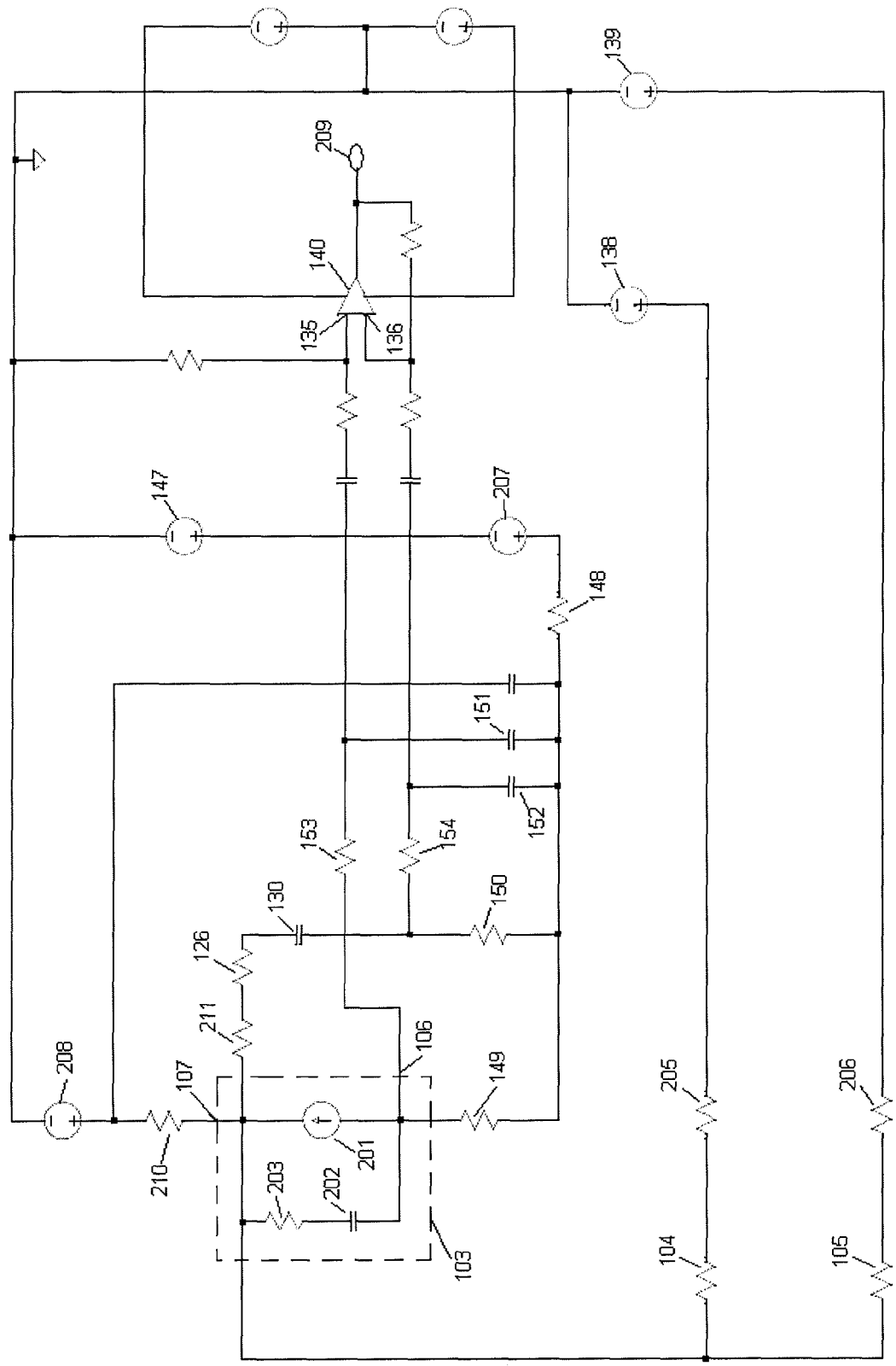
FIG. 5 shows a circuit diagram comprising a circuit assembly according to an embodiment of the present invention, which may be used for simulating an influence of switches.
Figure 6:
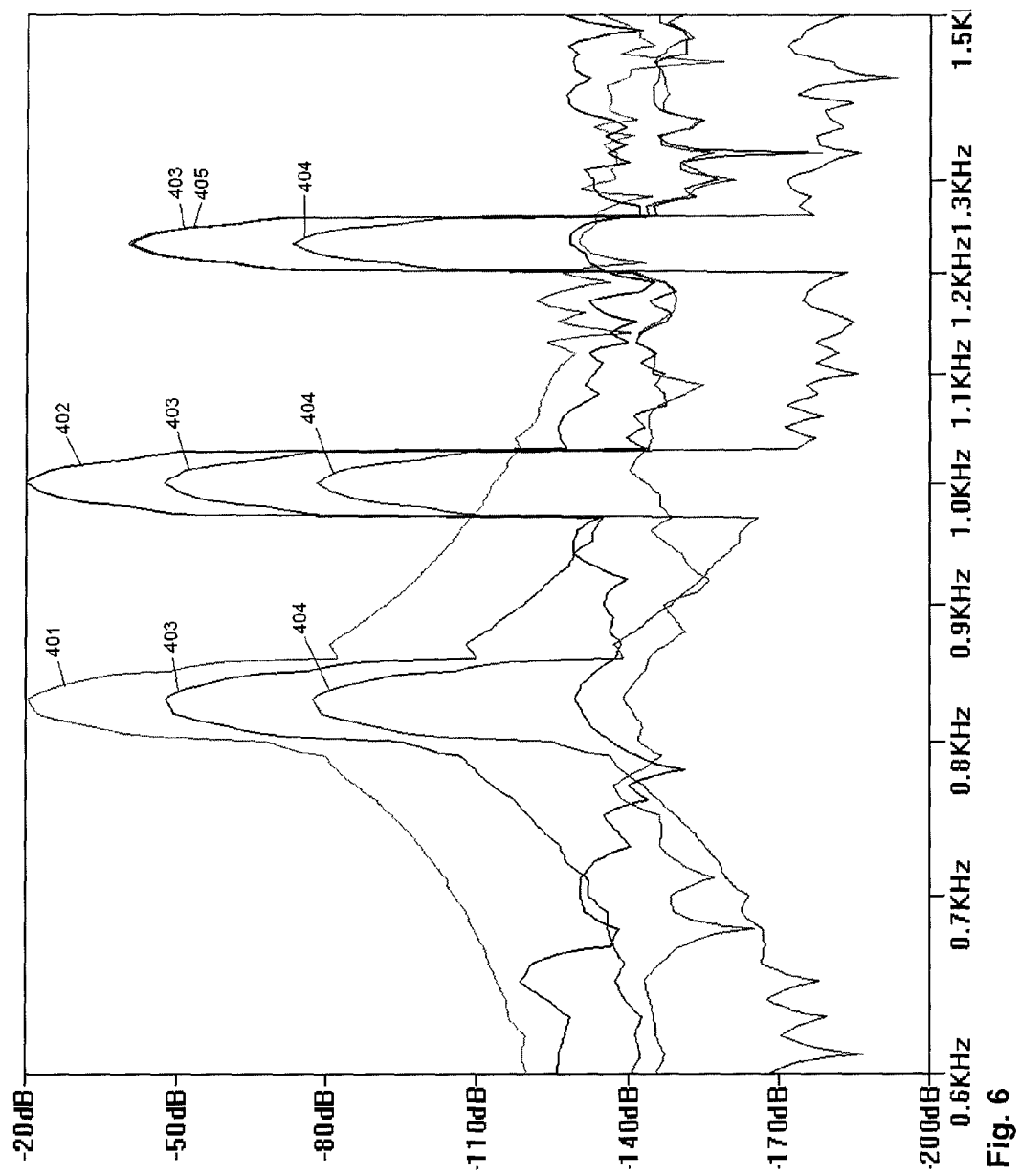
FIG. 6 shows simulation results of the circuit diagram of FIG. 5.

Simulation results of the circuit of FIG. 5 are depicted in FIG. 6. As can be seen from FIG. 6, the common mode rejection is now working on the echo from the audio signals from the earspeakers as well as on the bumblebee disturbance. The spectrum 404 of the microphone output signal 209 is now around 30 dB below the spectrum 403 of the echo disturbance on the common ground path.

Figure 7:
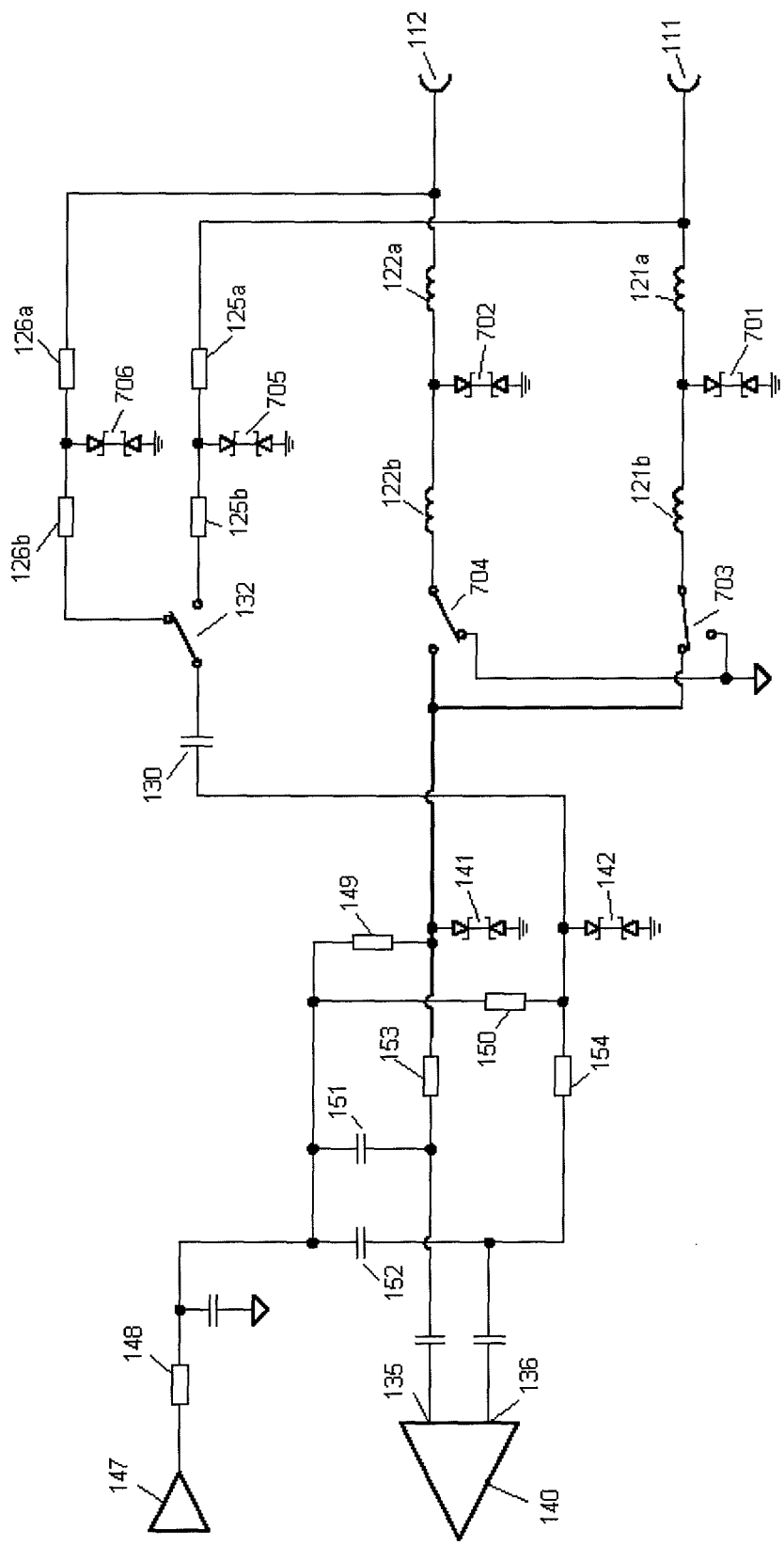
FIG. 7 shows a circuit diagram comprising a further circuit assembly according to an embodiment of the present invention.

FIG. 7 shows a further circuit diagram for coupling a portable hands free set (PHF) according to either an OMTP or a CTIA standard. Switches 703 and 704 provide the same cross connect switching logic as switches 131 and 133 of FIG. 1. Beads 121a and 122a are used for decoupling the radio frequency signal received by the PHF. Protection diodes 701 and 702 are used for ESD protection of the switches 703 and 704, respectively. Beads 121b and 122b serve for a current clamp protection. Furthermore, beads 121b and 122b contribute to an ESD protection together with diodes 701 and 702. DC resistance affects return echo, therefore, preferably beads with a low DC resistance may be used. An on-resistance of the switches 703 and 704 may also be low as the resistance adds to the return echo.

Capacitor 130, switch 132, and resistors 125a, 125b, 126a, 126b form a feedback net which may cancel unwanted signals on the ground connection of the audio connector 110. Furthermore, these components may improve current clamp and bumble-bee performance. Protection diodes 705, 706 and resistors 125b, 126b may serve for ESD protection of switch 132.

The invention claimed is:

1. A circuit assembly for processing an electrical signal of a microphone, the microphone having an inherent impedance and comprising a first electrical output and a second electrical output, wherein a voltage between the first electrical output and the second electrical output corresponds to an acoustic input signal received by the microphone, the circuit assembly comprising:
an impedance circuit,
a signal processing unit comprising a first input and a second input,
a first electrical signal path coupleable to the first electrical output of the microphone,
a second electrical signal path coupleable to the second electrical output of the microphone,
a first switch coupled to the first electrical signal path, the second electrical signal path, and the first input of the signal processing unit, and configured to selectively couple the first electrical signal path or the second electrical signal path to the first input of the signal processing unit, a second switch coupled to the first electrical signal path, the second electrical signal path, and ground, and configured to selectively couple the first electrical signal path or the second electrical signal path to ground via a further impedance circuit, and a third switch coupled to the first electrical signal path, the second electrical signal path, and the second input of the signal processing unit, and configured to selectively couple the first electrical signal path or the second electrical signal path to the second input of the signal processing unit via the impedance circuit, wherein an impedance value of the impedance circuit is selected based on an impedance value of the inherent impedance of the microphone.

2. The circuit assembly according to claim 1, wherein the first electrical signal path and the second electrical signal path are comprised in a multi-port plug-and-socket connection for detachably connecting the microphone to the first and second electrical signal paths.

3. The circuit assembly according to claim 2, wherein the multi-port plug and socket connection comprises furthermore a third electrical signal path, wherein the third electrical signal path is coupled to an electrical signal source feeding a further electrical signal with respect to ground into the third electrical signal path.

4. The circuit assembly according to claim 3, wherein the first, second or third electrical signal path is furthermore coupled to a radio frequency receiver adapted to receive an antenna signal via the first, second or third electrical signal path.

5. The circuit assembly according to claim 1, wherein the impedance value of the impedance circuit corresponds substantially to the impedance value of the inherent impedance of the microphone.

6. The circuit assembly according to claim 1, wherein the impedance circuit comprises a series connection of a resistive element and a capacitive element.

7. The circuit assembly according to claim 1, wherein an equivalent circuit of the microphone comprises a current source and the inherent impedance in parallel to the current source.

8. The circuit assembly according to claim 1, wherein the signal processing unit comprises a differential amplifier configured to generate an electrical microphone output signal based on a voltage difference at the first input and the second input.

9. The circuit assembly according to claim 1, further comprising:

a first low-pass filter being coupled to the first input of the signal processing unit, and a second low-pass filter being coupled to the second input of the signal processing unit.

10. A device comprising:

a multi-port plug-and-socket connection for coupling the device to a microphone, and a circuit assembly according to claim 1.

11. The device according to claim 10, wherein the device comprises at least one device of a group consisting of a mobile phone, a personal digital assistant, a mobile music player, and a navigation system.

12. A method of designing a circuit assembly for processing an electrical signal of a microphone, the microphone having an inherent impedance and comprising a first electrical output and a second electrical output, wherein a voltage between the first electrical output and the second electrical output corresponds to an acoustic input signal received by the microphone, the method comprising:

providing a signal processing unit configured to generate an electrical microphone output signal based on electrical microphone signals at a first input and a second input of the signal processing unit, coupling the first electrical output of the microphone to a first electrical signal path, coupling the second electrical output of the microphone to a second electrical signal path, coupling a first switch to the first electrical signal path, the second electrical signal path, and the first input of the signal processing unit, the first switch configured to selectively couple the first electrical signal path or the second electrical signal path to the first input of the signal processing unit, coupling a second switch to the first electrical signal path, the second electrical signal path, and ground, the second switch configured to selectively couple the first electrical signal path or the second electrical signal path to ground via a further impedance circuit, and coupling a third switch to the first electrical signal path, the second electrical signal path, and the second input of the signal processing unit, the third switch configured to selectively couple the first electrical signal path or the second electrical signal path to the second input of the signal processing unit via the impedance circuit, and selecting an impedance value of the impedance circuit based on an impedance value of the inherent impedance of the microphone.

* * * * *